United States Patent
Risberg

(10) Patent No.: US 9,307,323 B2
(45) Date of Patent: Apr. 5, 2016

(54) SYSTEM AND METHOD FOR BASS ENHANCEMENT

(71) Applicant: Actiwave AB, Solna (SE)

(72) Inventor: Pär Gunnars Risberg, Solna (SE)

(73) Assignee: Actiwave AB, Solna (SE)

( * ) Notice: Subject to any disclaimer, the term of this patent is extended or adjusted under 35 U.S.C. 154(b) by 0 days.

(21) Appl. No.: 14/359,416

(22) PCT Filed: Nov. 22, 2012

(86) PCT No.: PCT/EP2012/073418
§ 371 (c)(1),
(2) Date: May 20, 2014

(87) PCT Pub. No.: WO2013/076223
PCT Pub. Date: May 30, 2013

(65) Prior Publication Data
US 2015/0092973 A1  Apr. 2, 2015

Related U.S. Application Data

(60) Provisional application No. 61/562,542, filed on Nov. 22, 2011.

(51) Int. Cl.
*H04R 1/20* (2006.01)
*H04R 3/04* (2006.01)
*H03G 5/16* (2006.01)
*H03G 9/02* (2006.01)
*H04R 3/12* (2006.01)

(52) U.S. Cl.
CPC ............... *H04R 3/04* (2013.01); *H03G 5/165* (2013.01); *H03G 9/025* (2013.01); *H04R 3/12* (2013.01); *H04R 2499/11* (2013.01)

(58) Field of Classification Search
CPC ........ H04R 3/04; H04R 3/12; H04R 2499/11; H03G 5/165; H03G 9/025
See application file for complete search history.

(56) References Cited

U.S. PATENT DOCUMENTS

| | | | |
|---|---|---|---|
| 4,991,221 A * | 2/1991 | Rush | H04R 1/026 330/264 |
| 6,606,388 B1 | 8/2003 | Townsend et al. | |
| 2009/0052695 A1 | 2/2009 | Yamada et al. | |
| 2009/0122998 A1* | 5/2009 | Poortere | H04R 1/2826 381/59 |
| 2010/0086148 A1* | 4/2010 | Hung et al. | 381/98 |
| 2014/0112486 A1* | 4/2014 | Li | H04R 3/00 381/61 |
| 2014/0233744 A1* | 8/2014 | Risberg et al. | 381/61 |

FOREIGN PATENT DOCUMENTS

EP  1 915 026 A2  4/2008

OTHER PUBLICATIONS

International Search Report issued in corresponding application No. PCT/EP2012/073418 on Jan. 30, 2013.

* cited by examiner

*Primary Examiner* — Tuan D Nguyen
(74) *Attorney, Agent, or Firm* — Carter, DeLuca, Farrell & Schmidt, LLP

(57) ABSTRACT

A system and method for enhancing the real and/or perceived bass band of an audio signal is disclosed. A computationally simple yet effective bass band enhancement system for use in consumer electronics applications is disclosed. An audio processing system including bass enhancement functionality for use in a mobile audio system is disclosed.

25 Claims, 4 Drawing Sheets

SYSTEM AND METHOD FOR BASS ENHANCEMENT

BACKGROUND

1. Technical Field

The present disclosure is directed to systems and methods for processing an audio signal. In particular, it is directed towards systems and methods for enhancing the real and perceived bass band of an audio signal. Furthermore, it is directed towards systems and methods for enhancing audio performance in mobile audio applications.

2. Background

Audio signal reproduction, particularly in the lower frequency portion of the audio spectrum (e.g. bass spectrum), is generally limited by the nature and design of loudspeakers. In order to provide an audio signal with adequate bass loudness, one generally requires a large speaker area, a large excursion limit, and significant input power in order to move sufficient amounts of the surrounding fluid (e.g. air) to achieve the desired audible loudness.

Under the constraints of limited power availability and severe size restrictions, many modern audio systems employ algorithmic means for enhancing the bass spectrum of an audio signal (e.g. as opposed to utilizing large loudspeakers). It is well known in the art of audio signal processing that the impression of bass in an audio signal may be enhanced by the addition of harmonics of a bass fundamental tone to the audio signal without adding the fundamental tone itself. The harmonic tones suggest a fundamental tone even if the sound lacks a component at the fundamental frequency itself. The brain of a listener generally perceives the pitch of a tone not only by its fundamental frequency, but also via the higher harmonics. Thus, the brain of a listener assumes that the fundamental tone is there when the harmonic tones are registered, and therefore the listener may perceive the same pitch (perhaps with a different timbre) even if the fundamental frequency is missing from a tone. This phenomenon is commonly referred to as the missing fundamental phenomenon or psychoacoustic bass enhancement.

Algorithmic implementation of psychoacoustic bass enhancement may be particularly useful when the audio content is to be reproduced by small loudspeakers as mentioned above (e.g. as is the reality for the majority of modern mobile audio applications).

Yet psychoacoustic bass enhancement itself is not without significant limitations. The process adds a perceived distortion to the audio signal, which may be significant and distracting with certain forms of audio content (e.g. instrumental music).

A purer form of bass signal improvement is a real bass enhancement method, which may provide a superior audio experience versus a psychoacoustic bass enhancement. Yet, real bass enhancement is often hampered by the excursion limits and large signal distortion of the loudspeakers used in an audio processing system.

Thus there is a problem to determine whether or not psychoacoustic bass enhancement and/or real bass enhancement should be implemented in an audio stream and if so, to what degree either or both methods should be implemented.

SUMMARY

One objective of this disclosure is to provide a system and method for enhancing the real and/or perceived bass band of an audio signal. Another objective is to provide a computationally simple yet effective bass band enhancement system for use in consumer electronics applications. Yet another objective is to provide an audio processing system including bass enhancement functionality for use in a mobile audio system.

The above objectives are wholly or partially met by devices, systems, and methods according to the appended claims in accordance with the present disclosure. Features and aspects are set forth in the appended claims, in the following description, and in the annexed drawings in accordance with the present disclosure.

According to a first aspect there is provided, a bass enhancement system for producing an enhanced output signal from an input signal including a compressor configured to accept the input signal or a signal derived therefrom, including a compressor function to produce a first enhanced signal related to the input signal, and a control algorithm to produce an internal control signal related to one or more parameters of the input signal; a psychoacoustic bass enhancement block (PAB) configured to accept the internal control signal and the input signal or a signal derived therefrom, including a PAB function to produce a second enhanced signal dependent on the input signal and the internal control signal; and a combination block for mixing the first enhanced signal and the second enhanced signal to form the enhanced output signal.

In aspects, the bass enhancement system may include one or more filters (e.g. a low-pass, band-pass, and/or high-pass or the like) configured to accept the input signal so as to derive a signal therefrom and deliver the resulting signal to the compressor and/or PAB.

In aspects, the compressor function may include a limiter. The limiter may include a threshold parameter and may be configured to limit a power level of the first enhanced signal based upon the threshold parameter. The compressor may be configured to accept an external control signal and the threshold parameter may be dependent on the external control signal. The compressor may include a real bass enhancement function.

In aspects, the internal control signal may be related to a strength signal (e.g. a power signal, instantaneous power signal, averaged power signal, frequency band averaged signal, peak signal, an envelope, a filtered envelope, a Kalman-filtered power estimation technique, noise power spectral density, loudspeaker excursion estimators, an autocorrelation parameter, etc.) derived from the input signal or a signal derived therefrom.

In aspects, the PAB function may include a harmonic overtone generator (HOG) configured to derive one or more harmonics from the input signal and to add a proportion of the harmonics to the second enhanced signal dependent upon the internal control signal. The PAB function may include a clipper, an integrator, a multiplier, a convolution, a rectifier, a piecewise linear shaping function, a nonlinear transfer function, and/or an asymmetric polynomial function to calculate at least a portion of the second enhanced signal.

In aspects, the bass enhancement system may include a band generator, with one or more filters. One or more of the filters may be configured to generate one or more filtered signals from the input signal. The compressor and/or PAB may be configured to accept one or more of the filtered signals. The filters may include one or more cut-off frequencies, which may be dependent on an external control signal and/or the internal control signal.

In aspects, the bass enhancement system may include a controller configured to accept the input signal and to generate the external control signal. The controller may be configured to accept a feedback signal, and the external control signal may be dependent on the feedback signal.

According to another aspect there is provided, a method for producing an enhanced output signal with improved bass from an input signal including the steps of compressing the input signal or a signal derived therefrom to form a first enhanced signal; generating one or more harmonics from the input signal or a signal derived therefrom to form at least a portion of a second enhanced signal; monitoring one or more parameters of the input signal or a signal derived therefrom to form a strength signal; and mixing the first enhanced signal and the second enhanced signal in proportions dependent on the strength signal to form the enhanced output signal.

In aspects, the method may include limiting the first enhanced signal based on a threshold parameter (e.g. a signal strength parameter, a user input, a control signal value, a volume scale, a power setting [e.g. ultra-low power, low power, full power, etc.], a trade-off between audio quality and power, a filter frequency, etc.).

In aspects, the method may include accepting an external control signal, and setting the threshold parameter based upon the external control signal.

According to yet another aspect there is provided, a method for bass enhancing an audio input signal to produce an enhanced output signal including isolating one or more band signals from the audio input signal; amplifying one or more of the band signals with an adjustable gain parameter to form a first enhanced signal; applying a psychoacoustic audio enhancement algorithm to one or more band signals to form a second enhanced signal; delaying one or more band signals to form a delayed signal; and mixing the delayed signal, the first enhanced signal and the second enhanced signal to produce the enhanced output signal.

The method may include monitoring one or more band signals to produce a strength signal. The mixing, the amplifying and/or the psychoacoustic audio enhancement algorithm may be dependent upon the strength signal.

According to another aspect there is provided, use of a bass enhancement system in accordance with the present disclosure in a consumer electronic device. Some non-limiting examples of suitable consumer electronic devices include a loudspeaker driver, a cellular phone, a tablet computer, a laptop computer, a portable media player, a television, a portable gaming device, a gaming console, a gaming controller, a remote control, an appliance, a power tool, a robot, a toy, a greeting card, a home entertainment system, and the like.

According to yet another aspect there is provided, use of a bass enhancement system in accordance with the present disclosure in an audio processing system.

According to yet another aspect there is provided, a system for enhancing an audio signal including a means for isolating one or more frequency bands (e.g. band-1, band-2, band-3, band-m, band-n signals, etc.) from the audio signal, an adjustable gain enhancement (AGE) function configured to modify one or more band signals (e.g. the band-n signal), a psychoacoustic enhancement block (PAB) configured to act upon one or more of the band signals (e.g. the band-m signal), and an adaptive controller, configured for weighting the output of the PAB block and/or the AGE function to produce the enhanced audio signal.

DETAILED DESCRIPTION

Figure 1A:
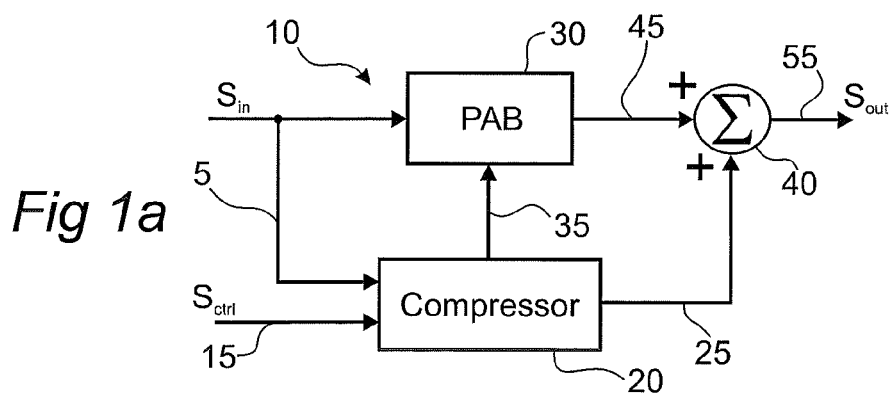
FIG. 1a shows an illustrative example of a bass enhancement system in accordance with the present disclosure.

Particular embodiments of the present disclosure are described hereinbelow with reference to the accompanying drawings; however, the disclosed embodiments are merely examples of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. Like reference numerals may refer to similar or identical elements throughout the description of the figures.

FIG. 1a shows an illustrative example of a bass enhancement system 10 in accordance with the present disclosure. The bass enhancement system 10 is configured to accept an input signal, $S_{in}$ 5 from an audio source (not explicitly shown) and an (optional) external control signal, $S_{ctrl}$ 15 from an external control source (not explicitly shown) to produce an enhanced signal, $S_{out}$ 55. The bass enhancement system 10 includes a psychoacoustic bass enhancement block (PAB) 30 and a compressor 20. The compressor 20 is configured to accept the input signal 5 or a related signal thereof (e.g. filtered, resampled, clipped, input signal 5, etc.), and the external control signal 15, and to produce a first enhanced signal 25 and an internal control signal 35. The PAB 30 is configured to accept the input signal 5 or a related signal therefrom (e.g. filtered, resampled, clipped, input signal 5, etc.) and the internal control signal 35, and to produce a second enhanced signal 45. The first enhanced signal 25 and the second enhanced signal 45 are combined (e.g. added, mixed, etc.) in a combination block 40 to produce the enhanced signal 55.

The input signal 5 may be a broad band audio signal, a modified audio signal, or the like.

In aspects, the system 10, the PAB 30 and/or the compressor 20 may include one more filters (e.g band pass filters, low pass filters, high pass filters, adaptable filters, polyphase FIR filters, FIR filters, etc.) for isolating one or more frequency bands (e.g. band-1, band-2, band-3, band-m, band-n signals, etc.) from the input signal 5 for further analysis and/or enhancement. In one non-limiting example, the compressor 20 may include filter for isolating a portion of the input signal content residing roughly within the bass audio range (e.g. 10-80 Hz, 30-60 Hz, 35-50 Hz, 100-300 Hz, 120-250 Hz, etc.). The compressor 20 may be configured to adjust the bandwidth limits of the filter in real-time (e.g. as directed by the external control signal 15).

In aspects, the system 10 may be embedded in an application specific integrated circuit (ASIC) or be provided as a hardware descriptive language block (e.g. VHDL, Verilog, etc.) for integration into a system on chip (SoC), an application specific integrated circuit (ASIC), a field programmable gate array (FPGA), or a digital signal processor (DSP) integrated circuit.

The system 10 may be implemented partially and/or wholly in software. In this non-limiting example, the system 10 may be implemented algorithmically as software for use on a general processor, a digital signal processor (DSP), or the like.

The compressor 20 may be configured to generate a first enhanced signal 25 with enhanced gain applied to one or more frequency bands of the input signal 5 (e.g. applied to a bass band portion thereof, etc.). The compressor 20 may include a compressor function, optionally dependent on the control signal 15, that acts upon the input signal 5 or a filtered version thereof (e.g. a band pass filtered version, a low pass filtered version, etc.) to generate the first enhanced signal 25. The compressor function may be a piecewise linear relationship, a limiting function, an exponential function, combination thereof, or the like.

In one non-limiting example, the compressor function may be configured as a hard limit as outlined below:

$$S_{fes} = \begin{cases} A*S_{in} & P_{in} \leq P_{th} \\ \frac{P_{th}}{P_{in}} S_{in} & P_{in} > P_{th} \end{cases} \qquad \text{equation 1}$$

where $P_{in}$ is a strength signal derived from the input signal, $S_{in}$ 5 or an equivalently filtered signal (e.g. a low pass filtered input signal, band-pass filtered input signal, etc.), $P_{th}$ is a threshold value, A is a gain parameter, and $S_{fes}$ represents the first enhanced output signal 25 from the compressor 20. The gain parameter A may be pre-configurable, related to the external control signal 15, a real-time control parameter, etc. The relationship may include several piecewise linear segments to efficiently shape the relationship in some applications.

In another non-limiting illustrative example, the function may be a non-linear relationship, such as outlined below:

$$S_{fes} = P_{th}(1 - \text{sgn}(S_{in}) \exp[-a*|S_{in}|]) \qquad \text{equation 2}$$

where $S_{in}$ represents the input signal 5 or an equivalently filtered signal derived therefrom (e.g. low pass filtered, band pass filtered, etc.), sgn(x) is a sign function, a is an optionally adjustable gain parameter, $P_{th}$ is a threshold value, optionally related to the power or strength of the input signal 5 or an equivalently filtered version thereof. The nonlinear relationship may be implemented in a customized hardware descriptive language block, a functionally equivalent hardware element (e.g. a diode, an exponential simulator, etc.), in software (e.g. as part of an audio processing algorithm), or the like.

Some non-limiting PAB algorithms for implementation within the PAB 30 include a clipper, an integrator, a multiplier, a convolution, a rectifier, a piecewise linear shaping function, a nonlinear transfer function, an asymmetric polynomial function, combinations thereof, or the like.

In one non-limiting example, the PAB 30 includes a rectifier in series connection with a gain limiter, the rectifier configured to generate harmonics from the input signal 5 (or signal generated therefrom) and the gain limiter, controlled by the control signal 35, configured to limit the amount of harmonics in the second enhanced signal 45 during use. The rectifier may be calculated as below:

$$S_{s\_int} = |S_{in}| \qquad \text{equation 3a}$$

where $S_{in}$ represents the input signal 5 or an equivalently filtered signal derived therefrom (e.g. low pass filtered, band pass filtered, etc.), $S_{s\_int}$ represents an intermediate rectified signal for generating even ordered harmonics of the input signal 5.

The second enhanced output signal 45 may be calculated from the intermediate rectified signal by a limiter, a gain controlled filter, etc. the gain, limiting parameters, etc. of which may be controlled by the internal control signal 35.

In aspects, the second enhanced signal 45 may be calculated according to a configurable FIR filter suitable for shaping the harmonics. Such an implementation may be calculated by:

$$S_{ses}[n] = \sum_{i=0}^{N} \delta_i S_{s\_int}[n-i] \qquad \text{equation 3b}$$

where $S_{s\_int}[n]$ is the $n^{th}$ sample of the intermediate rectified signal, $S_{ses}[n]$ is the second enhanced output signal 45, and $\delta_i$ are the filter coefficients, which may be at least partially derived or adaptably controllable by the internal control signal 35. The FIR function is of order N. The overall gain of the FIR filter may be controlled by the internal control signal 35 so as to limit and/or shape the harmonics generated within the PAB 30.

In aspects, the PAB 30 may include an asymmetric polynomial function as outlined below:

$$S_{ses} = \begin{cases} \sum_{i=0}^{Nc} c_i(S_{in})^i & P_{th} \leq P_{in} < P_{th2} \quad S_{in} > 0 \\ \sum_{i=0}^{Na} a_i(S_{in})^i & P_{in} < P_{th} \quad S_{in} > 0 \\ \sum_{i=0}^{Nb} b_i(S_{in})^i & P_{in} < P_{th} \quad S_{in} < 0 \\ \sum_{i=0}^{Nd} d_i(S_{in})^i & P_{th} \leq P_{in} < P_{th2} \quad S_{in} < 0 \end{cases} \qquad \text{equation 4}$$

where $S_{in}$ represents the input signal 5 or an equivalently filtered signal derived therefrom (e.g. low pass filtered, band pass filtered, etc.), coefficients $a_i$, $b_i$, $c_i$ and $d_i$, limits Na, Nb, Nc, and Nd are the orders of each polynomial respectively, and $S_{ses}$ represents the second enhanced output signal 45 from the PAB 30, $P_{th}$ is a threshold value below which the PAB 30 may output a significantly reduced signal, and $P_{th2}$ is a second threshold that may represent an ultimate acceptable power level for the system. Between threshold values $P_{th}$ and $P_{th2}$ the PAB 30 may output increasingly more significant harmonics with increasing strength level of $P_{in}$ (e.g. via the control signal 35 from the compressor 20). The asymmetric polynomial function may be configured to limit the output of the second enhanced output signal 45 when the strength signal $P_{in}$ is greater than the highest threshold value $P_{th2}$.

The polynomial coefficients $a_i$, $b_i$, $c_i$ and $d_i$ may be configured so as to give the overall smooth relationship with continuous $1^{st}$ and $2^{nd}$ derivatives that is monotonically increasing, asymmetric in $S_{in}$ (in order to generate odd and even harmonics), and such that $S_{ses}$ is zero or near zero when $S_{in}$ is zero (or an equivalent digital signal level used to represent a null input value).

The limits Na, Nb, Nc, and Nd may be selected so as to limit higher order derivatives of the relationship (i.e. so as to substantially reduce higher order harmonics). In one non-limiting example, the limits may be set to a finite value (e.g. 3, 4).

In aspects, the asymmetric polynomial function may be configured within the PAB 30 such that the PAB 30 may remove the fundamental signal (e.g. $S_{in}$ or a filtered version thereof) from the second enhanced output signal 45.

The PAB 30 may be configured so as to prevent calculation of the asymmetric polynomial function when the strength signal is less than a predetermined threshold value (e.g. when the strength signal is sufficiently low such that the entire output signal may be formed outside of the PAB 30).

Figure 1B:
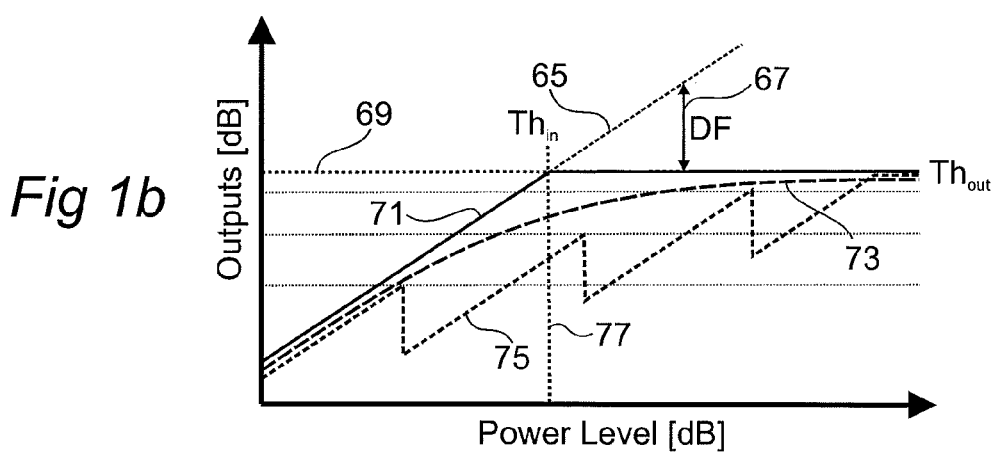
FIG. 1b shows some illustrative examples of signals that may be generated within a compressor in accordance with the present disclosure.

FIG. 1b shows some illustrative examples of signals that may be generated within a compressor in accordance with the present disclosure. A graph relating an input signal power level to a related output signal is shown (both axes are shown with logarithmic scales in this example). An input power level threshold $Th_{in}$ 77, and output power level threshold $Th_{out}$ 69 may be preconfigured, adjusted by the external control signal 15, or the like. A proportional signal 65 is shown, directly related to the input signal 5 (or filtered version thereof). A damping factor 67 may be calculated as the difference between the proportional signal 65 and the output power level threshold $Th_{out}$ 69.

FIG. 1b includes several illustrative examples of relationships between the power of an input signal 5 and the power of a first enhanced signal 25 as calculated within the compressor 20. One non-limiting example, shown in the solid line 71 is a hard limited relationship as calculated in one illustrative example by equation 1. Another non-limiting example is shown by the dashed line 73, wherein a smoothly varying non-linear relationship is used to calculate the first enhanced signal 25 from the input signal 5 (or filtered version thereof) as calculated in one illustrative example by equation 2. Some non-limiting examples of suitable non-linear relationships include piecewise linear relationships, polynomial relationships, hyperbolic relationships, exponential/logarithmic relationships, etc. Another non-limiting example is shown by the dotted line 75, wherein the output signal gain is decreased at predetermined thresholds (e.g. by changing the gain parameter A, by bit shifting the input signal 5, etc.). Such an implementation may be advantageous for use in a hardware efficient implementation of the compressor. The compressor may include a filter inserted after the function block. The filter may be used to soften or smooth any discontinuities that may be present in the function.

The damping factor 67 or a signal derived therefrom may be used to calculate the internal control signal 35. In one non-limiting example, the internal control signal 35 is directly proportional to the damping factor 67. In another non-limiting example, the internal control signal 35 may be related to the damping factor 67 by via polynomial function, via a polyphase FIR filter, via a nonlinear function, an adaptive algorithm, or the like.

The damping factor DF may be calculated from the strength signal, $P_{in}$. The strength signal may be derived from the input signal, $S_{in}$ (or filtered version thereof) in real-time. In one non-limiting example, the strength signal may be configured equal to the band-passed input signal. Some other non-limiting examples for calculating a strength signal from an associated input signal (or filtered version thereof) include, a power signal, instantaneous power signal, averaged power signal, frequency band averaged signal, peak signal, an envelope, a filtered envelope, a Kalman-filtered power estimation technique, noise power spectral density, loudspeaker excursion estimators, an autocorrelation parameter, or the like.

The compressor 20 may include a look-ahead buffer configured to ensure that smooth changes are maintained in the damping factor DF when an incoming transient is detected on the input signal 5 or a filtered version thereof.

The threshold value $P_{th}$ may be related and/or configured by the external control signal 15. The threshold value may be related to a control parameter, set by an external system. In aspects, the threshold parameter may be related to a volume scale, a power setting (e.g. ultra-low power, low power, full power, etc.), a trade-off between audio quality and power, or the like.

The compressor 20 may include an input filter (e.g. a bandpass filter, a low pass filter), a compression or limiting block, an output filter (e.g. a low-pass filter, etc.), a control unit (e.g. to calculate the internal control signal 35).

In aspects, the PAB 30 may include a function to calculate a pseudo bass signal, a distortion signal, one or more harmonic signals, etc. from the input signal 5 (or filtered signal derived therefrom). Thus the PAB 30 may contribute one or more harmonic and/or distortive effects to contribute at least a portion of the second enhanced signal 45. The function may be a psychoacoustic bass enhancement algorithm as known to one skilled in the art. In aspects, the PAB 30 may be configured to adjust the amplitude, the harmonic and/or distortive effects based on the internal control signal 35, the external control signal 15, or the like.

In aspects, the PAB 30 may be configured so as to increase the magnitude of at least a portion of the second enhanced signal 45 (e.g. the entire signal, a limited band, a low pass band, PAB generated harmonics, etc.) in correlation with the internal control signal 35 (e.g. as may be calculated from a damping factor 67, an input signal power level, etc.). In one non-limiting example, the PAB 30 may be configured to limit the psychoacoustic portion of the second enhanced signal 45 to zero or essentially zero until the input signal power level passes a signal strength threshold, $P_{th}$, after which the psychoacoustic portion of the second enhanced signal 45 is increased proportionally with the power level beyond the signal strength threshold, $P_{th}$.

In aspects, the bass enhancement system 10 may be configured so as to provide a first enhanced signal 25 proportional to an input signal 5 when the input signal 5 is of a substantially low power level (e.g. a signal with bass power level below strength signal threshold, $P_{th}$), while the output from the PAB 30 may be zero or substantially limited over this same signal range. The enhanced output signal 55 may be predominantly governed by the first enhanced signal 25 over this signal range (e.g. the second enhanced signal 45 being essentially zero). As the strength of the input signal 5 or an aspect thereof (e.g. bass signal strength, etc.) increases, the bass enhancement system 10 may be configured to shift from an enhanced output signal 55 predominantly determined by the first enhanced signal 25, to an enhanced output signal 55 predominantly determined by the second enhanced signal 45 as the strength signal increased during use (e.g. as the signal strength increases, the first enhanced signal 25 becomes substantially limited and is eventually eclipsed by the second enhanced signal 45). Such a configuration may be advantageous for balancing between high quality bass enhancement and increased output power from a smaller mobile speaker system (e.g. as included in a smartphone, a laptop, etc.).

Figure 2A:
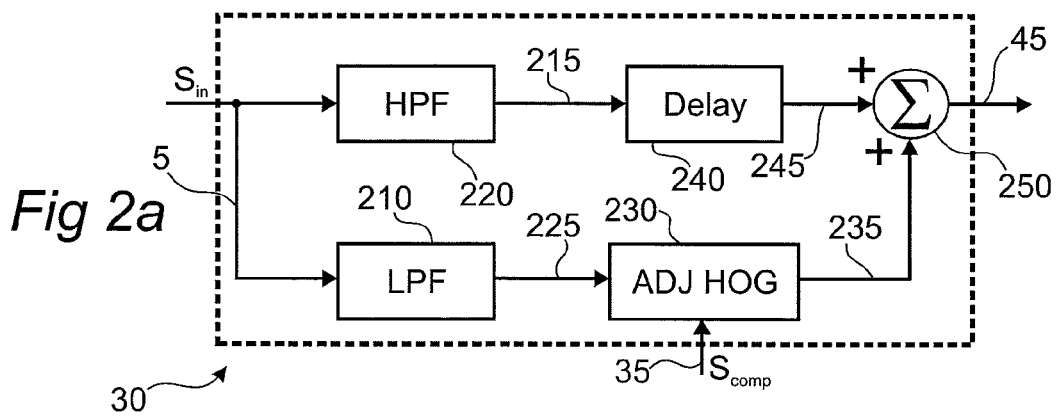
FIGS. 2a,b show some illustrative examples of an adaptive psychoacoustic bass block and a compressor in accordance with the present disclosure.

FIGS. 2a,b show illustrative examples of an adaptive psychoacoustic bass block (PAB) 30 and a compressor 20 each in accordance with the present disclosure. FIG. 2a shows an illustrative example of a PAB 30. The PAB 30 may include a low pass filter 210, an adjustable harmonic overtone generator (adjustable HOG) 230, a high pass filter 220, a delay 240, a combination block 250, combinations thereof, or the like. The PAB 30 may be configured to accept an input signal 5. The low pass filter 210 (e.g. a polyphase FIR filter, a decimator, etc.) may be configured to accept the input signal 5 and to produce a low passed signal 225. The adjustable HOG 230 may be configured to accept the low passed signal 225 and the internal control signal, $S_{comp}$ 35 and apply one or more psychoacoustic algorithms to produce a bass harmonic signal 235.

In aspects, the adjustable HOG 230 may be configured to output a null signal (e.g. no bass harmonic signal 235) in the case that the control signal 35 is zero or below a threshold value, and may increase the amplitude of the bass harmonic signal 235 in proportion to increases in the internal control signal 35 (e.g. as generated by the compressor 20) beyond the threshold value.

In aspects, the adjustable HOG 230 may be configured to provide a signal with substantially constant amplitude but the frequency range of the input to the HOG 230 may be shifted according to the internal and/or external control signal so as to vary the proportion of the resulting enhanced signal related to the HOG 230 or the RB or compressor.

The adjustable HOG 230 may include a clipper, an integrator, a multiplier, a convolution, a rectifier, a piecewise linear shaping function, a nonlinear transfer function, an asymmetric polynomial function (e.g. some non-limiting examples of which are outlined in equations 3a-b and 4), and the like for generating the one or more harmonics.

In aspects, the high pass filter 220 may be configured to accept the input signal 5 to produce a high passed signal 215. The delay 240 may be configured to accept the high passed signal 215 and produce a delayed signal 245. The combination block 250 may be configured to recombine the delayed signal 245 and the bass harmonic signal 235 to produce the second enhanced signal 45. The combination block 250 may include an addition function, mixing function, etc. The delay 240 may be preconfigured to introduce a lag to the high passed signal 215 so as to keep the phase delays between parallel signal chains in the bass enhancement system 10 synchronized during use.

Figure 2B:
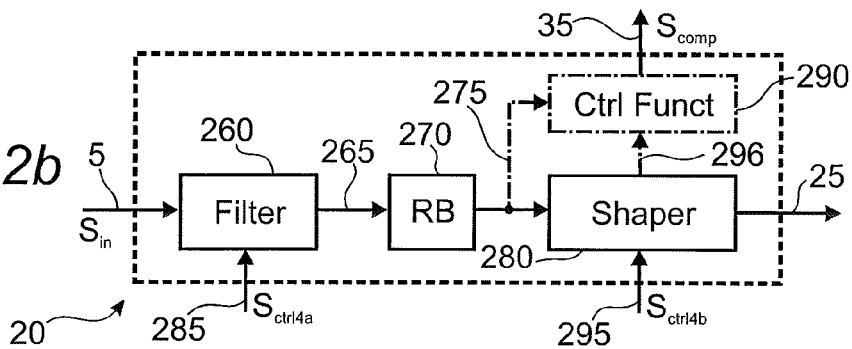

FIG. 2b shows an illustrative example of a compressor 20 in accordance with the present disclosure. The compressor 20 may include a compressor filter 260, a real bass enhancement block (RB) 270, a shaper 280, and a control function 290. The compressor filter 260 is configured to accept the input signal 5 (or a portion thereof) and produce a bass band signal 265. The filter 260 (e.g a band pass filter, low pass filter, high pass filter, adaptable filter, polyphase FIR filter, FIR filter, etc.) may be used to isolate one or more frequency bands (e.g. band-1, band-2, band-3, band-m, band-n signals, etc.) from the input signal 5 for further processing and/or enhancement. The filter 260 may be configured to accept an external control signal, $S_{ctrl4a}$ 285. The external control signal 285 may be used within the filter 260 to adjust a frequency cutoff, a gain, etc.

In aspects, the real bass enhancement block (RB) 270 may be configured to accept the bass band signal 265 and produce an intermediate bass enhanced signal 275. In one non-limiting example, the RB 270 may include a linear gain function as described in equation 1, to amplify the bass band portion of an input signal 5 without significant addition of distortion. The shaper 280 may be configured to accept the intermediate bass enhanced signal 275 and to calculate a first enhanced signal 25. The shaper 280 may include a hard limit function, completing a portion of the function as described in equation 1. In this illustrative example, the RB 270 and the shaper 280 may fulfill the function as described in equation 1.

Some non-limiting functionalities that may be provided by the RB 270 include Linkwitz compensation, a graphical or parametric EQ, or the like. In one non-limiting example, the RB 270 may include an inverse filter of an associated speaker and/or driver response configured to output against a target curve (e.g. a desired response) optionally with a lower roll-off than the uncompensated roll-off of the speaker.

In aspects, real bass enhancement block (RB) 270 may be located outside of the compressor 20.

The shaper 280 may accept an external control signal, $S_{ctrl4b}$ 295 which may be used within the shaper 280 to control one or more relationships and/or equation parameters (e.g. a threshold parameter, a gain parameter, etc.).

The shaper 280 may also produce a strength signal 296, related a one or more aspects of the input signal 5, and/or the intermediate bass enhanced signal 275. In aspects, the strength signal 296 may be calculated by the shaper 280 from the input signal 5 and/or the intermediate bass signal 275 (or filtered version thereof) in the form of a power signal, instantaneous power signal, averaged power signal, frequency band averaged signal, peak signal, an envelope, a filtered envelope, a Kalman-filtered power estimation technique, noise power spectral density, loudspeaker excursion estimator, an autocorrelation parameter, combinations thereof, or the like.

The compressor 20 may include a control function 290 configured to accept the strength signal 296 and produce an internal control signal 35. In the absence of the control function 290, the internal control signal 35 may be equal to the strength signal 296. The control function 290 may filter the strength signal 296 (e.g. low pass filter, band-pass filter, envelope filter, etc.). The internal control signal 35 may be accepted by various blocks within the bass enhancement system 10, may be used to generate a feedback signal for delivery to an external controller, etc.

The compressor 20 may include a look-ahead buffer configured to ensure that smooth changes are maintained in the damping factor DF when an incoming transient is detected on the input signal 5 or a filtered version thereof.

Figure 3A:
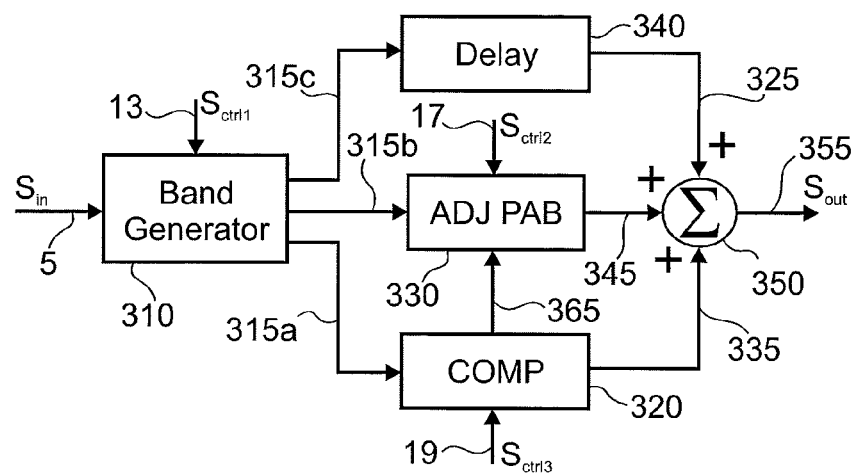
FIGS. 3a-d show another illustrative example of a bass enhancement system, associated signals and signal relationships in accordance with the present disclosure

FIGS. 3a-d show another illustrative example of a bass enhancement system and some associated signals and signal relationships in accordance with the present disclosure. FIG. 3a shows an illustrative example of a bass enhancement system including a band generator 310, a compressor 320, an adjustable psychoacoustic bass enhancement block (PAB) 330, a delay 340 and a combination block 350. The band generator 310 may be configured to accept an input signal, $S_{in}$ 5 and optionally an external control signal, $S_{ctrl1}$ 13, and to compute one or more filtered signals 315a-c. The band generator 310 may include a plurality of filters (e.g. cross overs, band-pass filters, low pass filters, adaptive filters, etc.) to segment out one or more portions of the input signal 5 into the filtered signals 315a-c. The filter parameters (e.g. cross over frequencies, gains, etc.) of the filters within the band generator 310 may be adjustable in real-time, and may be controlled by the external control signal 13, or the internal control signal (link not explicitly shown) generated in the compressor 320. In one-non-limiting example, the cross over frequencies of the filters (and subsequently frequency content of the filtered signals 315a-c) may be varied in real-time by the external control signal 13.

The band generator 310 may include a control function (not explicitly shown) for calculating a control signal from the input signal 5 and/or the external control signal 13, for adjusting the filter parameters in real-time. In aspects, the band generator 310 may be configured to output a filtered signal 315a with frequency content in the bass audio range (e.g. 10-80 Hz, 30-60 Hz, 35-50 Hz; for laptops and smartphones, 50-300 Hz, 100-250 Hz; for loudspeakers 30-80 Hz, etc.). The band generator 310 may include a high pass filter to remove exceptionally low frequency content (e.g. less than 100 Hz, less than 30 Hz, less than 10 Hz, etc.) from the input signal 5. The compressor 320 in accordance with the present disclosure may be configured to accept one or more filtered signals 315a, and optionally an external control signal, $S_{ctrl1}$ 19, and to produce a first enhanced signal 335, and an internal control signal 365 (e.g. so as to control an associated PAB 330). The first enhanced signal 335 may be limited or shaped within the compressor 320 in accordance with the present disclosure.

In aspects, the band generator 310 may limit the bandwidth of the filtered signal 315a delivered to the compressor based upon a strength parameter of the input signal 5 or one or more of the filtered signals 315a-c (e.g. an power signal, filtered power signal, envelop signal, etc.). Thus the overall power level of the filtered signal 315a may be capped in real-time based on variation in the cutoff frequencies of the filters within the band generator 310.

In aspects, the compressor 320 may include a compressor filter, a real bass enhancement block (RB), a shaper, and a control function, each in accordance with the present disclosure. The compressor 320 may be configured to accept a filtered signal 315a and an external control signal 19 and produce a first enhanced signal 335 and an internal control signal 365 in accordance with the present disclosure. One or more functional components within the compressor 320 may be configured to accept the external control signal, $S_{ctrl4a}$ 285. The external control signal 285 may be used within the filter 260 to adjust a frequency cutoff, a gain, etc.

The compressor 320 may include a look-ahead buffer configured to ensure that smooth changes are maintained in the damping factor DF when an incoming transient is detected on the input signal 5, a filtered signal 315a-c, or a related signal within the system.

The PAB 330 may be configured to accept a filtered signal 315b, the internal control signal 365 generated by the compressor 320, an external control signal $S_{ctrl2}$ 17 and produce a second enhanced signal 345. The PAB 330 may generate harmonic content from the filtered signal 315b in conjunction with the internal control signal 365 (e.g. optionally as an amplitude control), and the external control signal 17 (e.g. optionally as a system setting control, an enable signal, etc.). In aspects, the second enhanced signal 345 may include substantially negligible harmonic content when the bass power level of the input signal 5 is below a threshold value. Upon an increase in the bass power level of the input signal 5, increasing harmonic content may be incorporated into the second enhanced signal 345 by the PAB 330.

Some non-limiting PAB algorithms for implementation within the PAB 330 include a clipper, an integrator, a multiplier, a convolution, a rectifier, a piecewise linear shaping function, a nonlinear transfer function, an asymmetric polynomial function (e.g. some non-limiting examples of which are outlined in equations 3a-b and 4), and the like.

The delay 340 may be configured to accept the filtered signal 315c (e.g. a high pass filtered input signal 5, a band pass filtered input signal 5, etc.) and produce a delayed signal 325. The delay 340 may be configured so as to ensure that all parallel signal chains (e.g. via the PAB 330, via the compressor 320, etc.) arrive synchronously at the combination block 350.

The delayed signal 325, the first enhanced signal 335 and the second enhanced signal 345 may be combined in the combination block 350, for example by mixing, by adding, etc. to form the enhanced output signal, $S_{out}$ 355.

In aspects, the compressor 320 may include a limiting function (e.g. to ensure the power level of the first enhanced signal 335 is maintained below a threshold value, etc.). Alternatively, additionally or in combination, a limiting function may be included in combination block 350 or within the system after the combination block 350 in order to ensure that the enhanced output signal 355 will not cause over-flow or clipping.

In aspects, the same filtered signal 315a-c may be delivered to both the compressor 320 and the PAB 330. The internal control signal 365, generated by the compressor 320 may be used to weight the individual contribution from the PAB 330 and the compressor 320. Alternatively, additionally, or in combination, the filtered signals 315a-c may include overlapping portions, such portions optionally being controllable by the internal control signal 365 and/or external control signal 13, 17, 19.

Figure 3B:
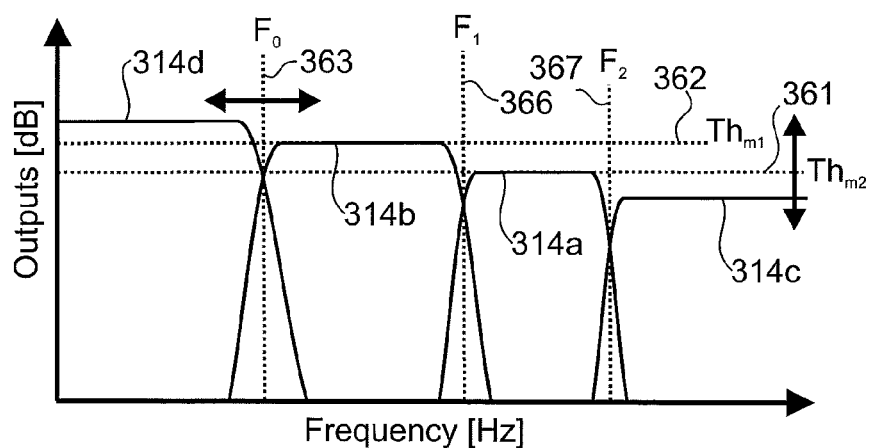

FIG. 3b shows an illustrative example of a low pass band 314d, band pass filters 314a-b, and a high pass band 314c that may be applied in the band generator 310 to produce the filtered signals 315a-c. In this example, the input signal 5 may be split so as to exclude a low pass portion illustrated by the low pass band 314d (a signal that may be sufficiently low frequency so as to discard from further analysis), a low-band filter 314b to produce the low-band filtered signal 315b (e.g. for delivery to the PAB 330), a mid-band filter 314a to produce a mid-band filtered signal 315a (e.g. for delivery to the compressor 320), and a high pass filter 314c to produce a high pass filtered signal 315c (e.g. for delivery to the delay 340). The cross over frequencies 363, 366, 367 may be adjustable within the band generator 310. In aspects, the cross over frequencies 363, 366, 367 may be adjusted so as to limit the signal power within one or more filtered signals 315a-c. The band generator 310 may adjust the gain associated with one or more the filters 314a-c. Two illustrative adjustable gain parameters 361, 362 are shown associated with the filters 314a, 314b respectively. The adjustable gain parameters 361, 362 may be adjusted based on an external control signal 13, a strength parameter of the input signal (or portion thereof), etc. so as to adjust the gain of the filtered signals 315a,b independently.

Figure 3C:
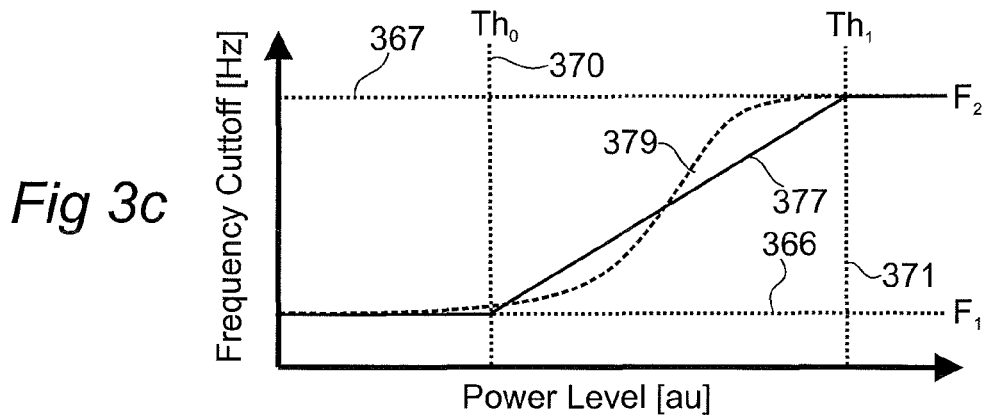

FIG. 3c shows an illustrative example of some relationships 377, 379 between a power level of the input signal 5 and/or one or more filtered signals 315a-c (or portion thereof) and a cut-off frequency used in the generation of one or more of the filtered signals 315a-c (i.e. in this case the cross-over frequency located between a low band filter 314b and a mid-band filter 314a). Two illustrative relationships 377, 379 are shown.

In the piecewise linear relationship 377, the cross-over frequency is maintained at a first frequency $F_1$ 366 when the power level of the input signal (or filtered equivalent thereof) is measured below a first power threshold $Th_0$ 370. As the power level of the input signal 5 increases, the cross-over frequency linearly shifts between the first frequency $F_1$ 366 and a second frequency $F_2$ 367 at a second power threshold $Th_1$ 371. In one-non limiting example, the energy associated with the mid-band filtered signal 315a may be limited to a finite value and/or tend to zero as the power level increases past the second power threshold $Th_1$ 371. The power thresholds 370, 371 may be controlled by the external control signal 13, a power level of the input signal 5, and/or a power level of one or more filtered signals 315a-c, etc. The piecewise linear relationship may include additional threshold values so as to tailor the input-output relationship and power transitions for particular applications.

In aspects, relating to the curved relationship 379, the cross-over frequency may shift gradually from a first frequency $F_1$ 366 towards a second frequency $F_2$ 367 as the power level of the input signal 5 increases indefinitely. In the illustrative example shown, the curved relationship 379 may be substantially s-shaped, the overall characteristics of the s-shaped curve may be adjustable by the power level thresholds 370, 371 and/or the frequencies 366, 367.

A range of relationships may be implemented so as to optimize and/or customize the relationships between the input signal 5 and the filtered signals 315a-c.

Figure 3D:
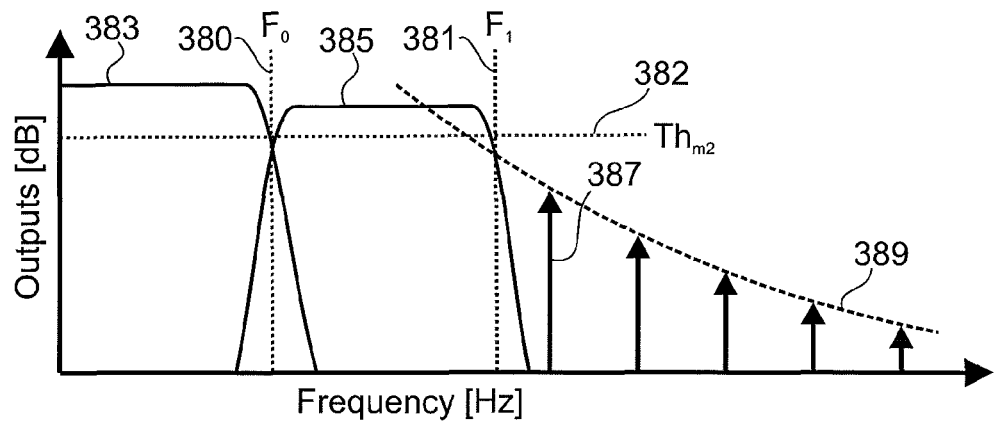

FIG. 3d shows a non-limiting illustrative example of aspects of a second enhanced signal 345 as produced by an operable PAB 330. A low passed filter 383 may be used to discard a portion of the input signal 5 that is sufficiently low in frequency so as to be neglected from further analysis (e.g. less than 100 Hz, less than 50 Hz, less than 20 Hz, etc.). A filtered band 385 associated with a filtered signal 315b is shown sandwiched between a first cross-over frequency, $F_0$ 380, and a second cross over frequency, $F_1$ 381. The associated filtered signal 315b may be operably delivered to a PAB 330. The PAB 330 may generate one or more psychoacoustic signals from the filtered signal 315b, thus generating one or more harmonics 387 for each tone of the filtered signal 315b.

The harmonics 387 may be shaped by the particular transfer function of the PAB 330. An illustrative example of a harmonic shaping envelope 389 is shown so as to indicate this relationship. The values, fall-off thereof, and/or overall shaping of the harmonics 387 may be determined by a psychoacoustic relationship (e.g. a human response curve, a system correction frequency response, a response envelope, etc.). The harmonic portion of the second enhanced signal 345 may be produced from a summation of harmonics 387 associated with each tone of the filtered signal 315a within the filtered band 385. In one non-limiting example the shaping of the harmonics 385 may be achieved by a nonlinear function within the PAB 30.

The harmonics shaping envelope 389 may also be dependent upon the control signal 13. In aspects, the relationship between the input 5 and filtered signals 315a-c may be heavily weighted so as to favor one filtered signal 315a at low control signal 13 levels, and favor an alternative filtered signal 315b at relatively high control signal 13 levels. Such a relationship may be advantageous for implementing a dynamic loudness variant for the psychoacoustic aspects of an audio input signal 5 in order to better match human perception levels. The harmonics shaping envelope 389 may be adjustable from the external control signal 13 (e.g. slope adjustment, for different user settings, different power levels, etc.).

The PAB harmonics may be generated by a clipper, an integrator, a multiplier, a convolution, a rectifier, a piecewise linear shaping function, a nonlinear transfer function, an asymmetric polynomial function (e.g. some non-limiting examples of which are outlined in equations 3a-b and 4), and the like.

Figure 4:
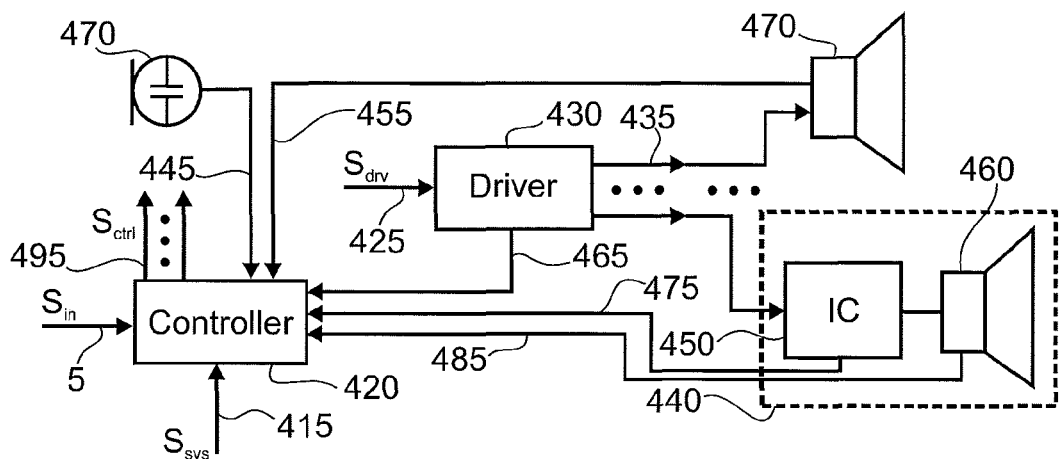
FIG. 4 shows an illustrative example of a controller and some illustrative feedback mechanisms in accordance with the present disclosure.

FIG. 4 shows an illustrative example of a controller 420 and some illustrative feedback mechanisms in accordance with the present disclosure. The controller 420 may be configured to generate one or more control signals, $S_{ctrl}$ 495 (equivalently considered external control signals). The control signals 495 maybe used by various blocks in the bass enhancement system 10 to control gain adjustments, adapt filter parameters, or the like. The controller 420 may be configured to accept the input signal 5 to contribute to the generation of the control signals 495. In one non-limiting example, the controller 420 may be configured to accept the input signal 5 and to generate one or more control signals 495 with an entirely feed forward signal path. The controller 420 may be configured to accept a system control signal $S_{sys}$ 415 to adjust one or more control signals 495.

The system control signal 415 may be a power management signal, a volume scale, a power setting (e.g. ultra-low power, low power, full power, etc.), a signal related to trade-off between audio quality and power, a user input signal, or the like.

The audio processing system may include a driver 430. The driver 430 may be driven by an audio processing output signal 425, at least partially dependent on the enhanced signal 55, 355. The driver 430 may be configured to generate one or more output signals 435 for driving one or more loudspeakers 460, 470, loudspeaker driver modules 440, and/or integrated circuits 450 included therein. The controller 420 may be configured to accept one or more feedback signals 445, 455, 465, 475, 485 from one or more audio components within a complete audio signal processing system. Some non-limiting examples include current, voltage, and/or temperature feedback signal 465 from the driver 430, a current, voltage, displacement, temperature, and/or acceleration feedback signal 455, 485 from one or more of the loudspeakers 460, 470, and a current, voltage, impedance, temperature, limiter, and/or envelop feedback signal 475 from one or more integrated circuits 450 included in the audio processing system.

The controller 420 may be configured to accept an audio feedback signal 445 as operably produced by one or more microphones 470 included in the audio processing system. The controller 420 may be coupled to a feedback signal (not explicitly shown) from one or more accelerometers, gyroscopes, GPS sensors, temperature sensors, humidity sensors, battery life sensors, current sensors, magnetic field sensors, or the like.

A range of feedback algorithms may be implemented in the controller 420 to relate the feedback signals 445, 455, 465, 475, 485 to the control signals 495. Some non-limiting examples of feedback algorithms include speaker/drive temperature overload feedback, negative feedback based on one or more aspects of the audio feedback signal 445 (e.g. an amplitude based feedback, a distortion based feedback, etc.), a distortion limiting algorithm (e.g. via measurement of the audio feedback signal 445), etc.

Figure 5:
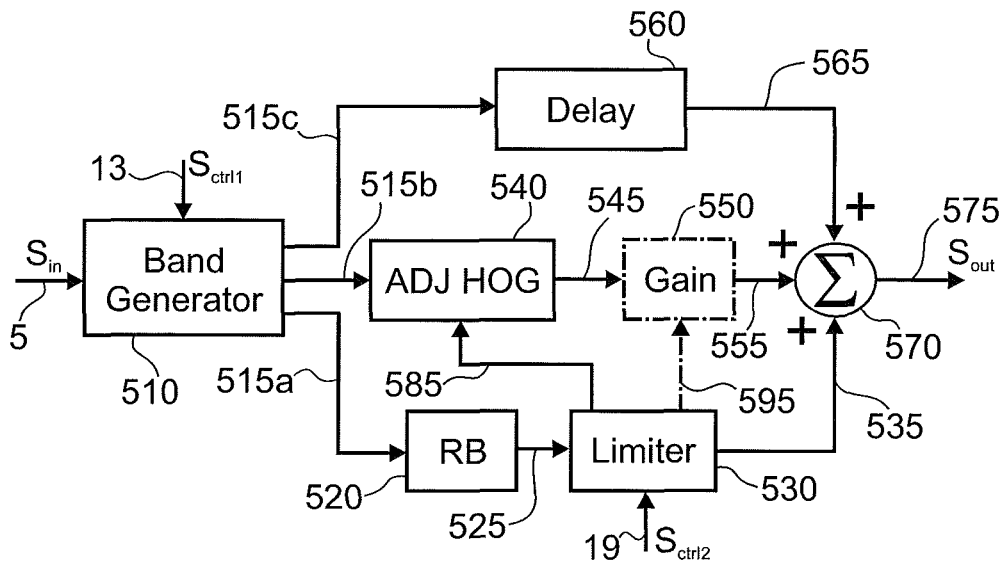
FIGS. 5-6 show illustrative examples of bass enhancement systems in accordance with the present disclosure.
Figure 6:
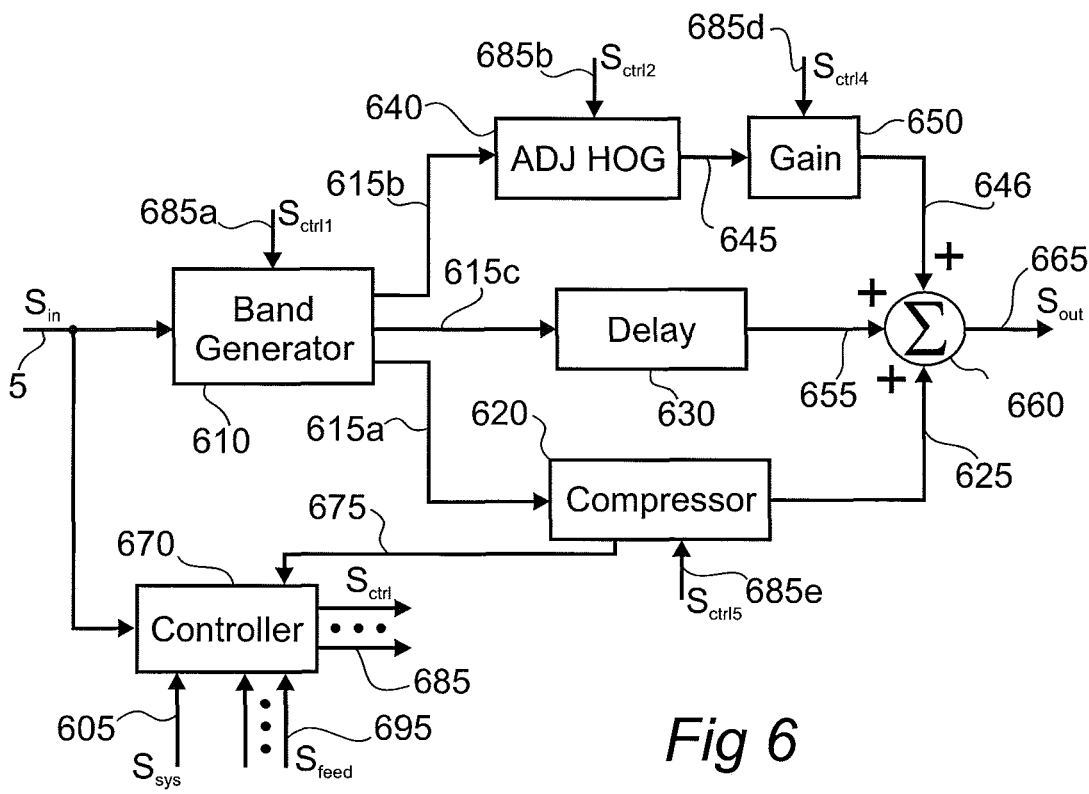

FIGS. 5-6 show illustrative examples of bass enhancement systems in accordance with the present disclosure.

FIG. 5 shows a bass enhancement system including a band generator 510, a real bass enhancement block (RB) 520, a limiter 530, an adjustable harmonic overtone generator (HOG) 540, a gain block 550, a delay 560 and a combination block 570. The band generator 510 may be configured to accept an input signal 5 from an external source (not explicitly shown), a control signal, $S_{ctrl1}$ 13 to generate one or more filtered signals 515a-c. The RB 520 may be configured to accept one or more filtered signals 515a and to produce an intermediate bass enhanced signal 525.

In one non-limiting example, the RB 520 may include a linear gain function as described in equation 1, to amplify the filtered signal 515a without significant addition of distortion.

In aspects, the limiter 530 may be configured to accept the intermediate bass enhanced signal 525 and to calculate a first enhanced signal 535. The limiter 530 may include a hard limit, as described in equation 1 to prevent the power and/or signal level of the intermediate bass enhanced signal 525 from exceeding a threshold value. The threshold value may be configured by the control signal $S_{ctrl2}$ 19. The limiter 530 may produce one or more internal control signals 585, 595 for use in controlling one or more other blocks in the bass enhancement system. One or more of the control signals 585, 595 may be derived from an input power level, a strength signal, etc.

The delay 560 may be configured to accept a filtered signal 515c and to produce a delayed signal 565. The delay 560 may be preconfigured to introduce a lag to the filtered signal 515c so as to keep the phase delays between parallel signal chains in the bass enhancement system synchronized during use.

The HOG 540 may be configured to accept a filtered signal 515*b* and to generate a psychoacoustic enhanced signal 545. The HOG 540 may be configured to accept an internal control signal 585 generated by the limiter 530 so as to adjust the amplitude and/or parameters of the psychoacoustic enhanced signal 545. The gain block 550 may be configured to apply an adjustable gain (e.g. as controlled by a second internal control signal 595 operably generated by the limiter 530) to the psychoacoustic enhanced signal 545 to produce a second enhanced signal 555.

The adjustable HOG 540 may include a clipper, an integrator, a multiplier, a convolution, a rectifier, a piecewise linear shaping function, a nonlinear transfer function, an asymmetric polynomial function (e.g. some non-limiting examples of which are outlined in equations 3a-b and 4), combinations thereof, or the like for generating the one or more harmonics.

The delayed signal 565, the second enhanced signal 555, and/or the first enhanced signal 535 may be combined (e.g. added, mixed, etc.) in the combination block 570 to produce an enhanced output signal $S_{out}$ 575.

FIG. 6 shows an illustrative example of a bass enhancement system in accordance with the present disclosure. The bass enhancement system may include a band generator 610, a compressor 620, a delay 630, an adjustable harmonic overtone generator (HOG) 640, a gain block 650, a combination block 660, and a controller 670 each in accordance with the present disclosure. The band generator 610 may be configured to accept an input signal 5 from an external source (not explicitly shown), a control signal, $S_{ctrl1}$ 685*a* generated by the controller 670, to generate one or more filtered signals 615*a*-*c*. The compressor 620 may accept one or more filtered signals 615*a* and produce a first enhanced signal 625. The compressor may be configured to accept a control signal $S_{ctrl5}$ 685*e* from the controller 670 and generate an internal control signal 675 for feedback to the controller 670. The internal control signal 675 may be derived from and/or related to the input signal 5, the filtered signal 615*a*, etc.

In one non-limiting example, the internal control signal 675 may be derived from the power level of the input signal 5 (or filtered version thereof), and/or one or more strength signals.

The compressor 620 may include a hard limit, as described in equation 1 to prevent the power and/or signal level of the first enhanced signal 625 from exceeding a threshold value. The threshold value may be configured by the control signal $S_{ctrl5}$ 685*e* and/or relate to a metric, power level, strength level of the filtered signal 615*a* and/or the input signal 5.

The compressor 620 may include a look-ahead buffer configured to ensure that smooth changes are maintained in the damping factor DF when an incoming transient is detected on the input signal 5, a filtered signal 615*a*-*c*, or a related signal within the system.

The delay 630 may be configured to accept a filtered signal 615*c* and to produce a delayed signal 655. The delay 630 may be preconfigured to introduce a lag to the filtered signal 615*c* so as to keep the phase delays between parallel signal chains in the bass enhancement system synchronized during use.

The HOG 640 may be configured to accept a filtered signal 615*b* and to generate a psychoacoustic enhanced signal 645. The HOG 640 may accept a control signal $S_{ctrl2}$ 685*b* generated by the controller 670 and/or originating from the internal control signal 675 so as to adjust the amplitude and/or parameters of the psychoacoustic enhanced signal 645. The gain block 650 may be configured to apply an adjustable gain (e.g. as controlled by a control signal $S_{ctrl4}$ 685*d*) to the psychoacoustic enhanced signal 645 to produce a second enhanced signal 646.

The delayed signal 655, the second enhanced signal 646, and the first enhanced signal 625 may be combined (e.g. added, mixed, etc.) in the combination block 660 to produce an enhanced output signal $S_{out}$ 665.

The controller 670 is configured to accept an input signal 5, a system control signal $S_{sys}$ 605, one or more feedback signals $S_{feed}$ 695, and/or the internal control signal 675 to produce one or more control signals 685.

The controller 420, 670 may include functions relating one or more of the control signals 495, 685 to one or more signal power levels, the power of one or more signals in a particular frequency band, the peak excursion of a loudspeaker, current draw from a speaker driver, a mixing algorithm to adjust between filtered signals 315*a*-*c*, 515*a*-*c*, 615*a*-*c*, an adjustable limiter parameter for tuning the amount of harmonics in the one or more signals and optionally for adjusting the maximal speaker power consumption, and/or one or more system parameters based on known performance metrics in order to ease into power limits associated with the system, etc.

In aspects, the external control signal 15 may include an audio volume relationship, a power management signal, a system acoustic parameter, etc.

The PAB 30, 330 and/or the HOG 230, 540, 640 may include one or more psychoacoustic algorithms and variants, additional filters to maintain in-band output or to limit content in one or more alternative bands, etc.

The compressor 20, 320, 620 and/or the limiter 530 may include one or more frequency dependent gain functions, system specific acoustic compensation coefficients, etc.

Another illustrative example is a system for enhancing an audio signal with one or more audio bands (e.g. a bass band, a treble band, etc.) including a bass compressor, configured to amplify the bass band of the audio signal to form a bass enhanced audio signal and to generate a control signal, a psychoacoustic enhancement block (PAB) configured to generate a psychoacoustic enhanced signal from one or more bands of the audio signal and the control signal; and mixer for generating an enhanced audio signal from the psychoacoustic enhanced signal and the bass enhanced signal.

Yet another illustrative example is a method for enhancing an audio signal including isolating one or more band signals from the audio signal, amplifying one or more band signals with an adjustable gain parameter, applying a psychoacoustic audio enhancement algorithm to one or more band signals, generating one or more strength signals from one or more parameters of the input signal, and mixing the band signals based on the strength signal to form an enhanced output signal. In aspects, the method may include reducing or eliminating the psychoacoustic audio portion of the enhanced output signal when the strength signal is below a threshold value and increasing the psychoacoustic audio portion of the enhanced output signal when the strength signal is above the threshold value.

Another illustrative example is an audio processing apparatus for use in a mobile audio application (e.g. as part of a consumer electronics device, a smartphone, etc.), including a bass enhancement system in accordance with the present disclosure. Such a configuration may be advantageous for maximizing the useful bandwidth and performance available from generally undersized loudspeakers used in mobile audio applications.

It will be appreciated that additional advantages and modifications will readily occur to those skilled in the art. Therefore, the disclosures presented herein and broader aspects thereof are not limited to the specific details and representative embodiments shown and described herein. Accordingly, many modifications, equivalents, and improvements may be included without departing from the spirit or scope of the general inventive concept as defined by the appended claims and their equivalents.

What is claimed is:

1. A bass enhancement system for producing an enhanced output signal from an input signal comprising:
    a compressor configured to accept the input signal or a signal derived therefrom, the compressor including a compressor function to produce a first enhanced signal related to the input signal, and compressor further including a control algorithm to produce an internal control signal related to one or more parameters of the input signal, wherein the internal control signal takes a form of a loudspeaker excursion estimation;
    a psychoacoustic bass enhancement block (PAB) configured to accept the internal control signal and the input signal or a signal derived therefrom, the PAB including a PAB function to produce a second enhanced signal dependent on the input signal and the internal control signal; and
    a combination block for mixing the first enhanced signal and the second enhanced signal to form the enhanced output signal.

2. The bass enhancement system in accordance with claim 1, wherein the compressor function comprises a limiter having a threshold parameter, the limiter configured to limit a power level of the first enhanced signal based upon the threshold parameter.

3. The bass enhancement system in accordance with claim 2, wherein the compressor is configured to accept an external control signal, the threshold parameter dependent on the external control signal.

4. The bass enhancement system in accordance with claim 3, further comprising a controller configured to accept the input signal and to generate the external control signal.

5. The bass enhancement system in accordance with claim 4, wherein the controller is configured to accept a feedback signal, the external control signal dependent on the feedback signal.

6. The bass enhancement system in accordance with claim 2, wherein the compressor function comprises a non-linear algorithm to form the first enhanced signal.

7. The bass enhanced system in accordance with claim 6, wherein the non-linear algorithm is selected from a group consisting of a piecewise linear function, an exponential function, and a soft limiting function.

8. The bass enhancement system in accordance with claim 1, wherein the internal control signal is related to a power level of the input signal or signal derived therefrom.

9. The bass enhancement system in accordance with claim 1, wherein the PAB function comprises a harmonic overtone generator (HOG) configured to derive one or more harmonics from the input signal and to add a proportion of the harmonics to the second enhanced signal dependent upon the internal control signal.

10. The bass enhancement system in accordance with claim 1, wherein the PAB function comprises at least one of a clipper, an integrator, a multiplier, a convolution, a rectifier, a piecewise linear shaping function, a nonlinear transfer function, and/or an asymmetric polynomial function to calculate at least a portion of the second enhanced signal.

11. The bass enhancement system in accordance with claim 1, wherein the PAB function comprises a high pass filter to generate a high pass filtered signal from the input signal or signal derived therefrom, and a delay, configured to delay the high pass filtered signal to form a delayed signal, the combination block configured to mix the delayed signal with the first enhanced signal and the second enhanced signal to form the enhanced output signal.

12. The bass enhancement system in accordance with claim 1, wherein the compressor and/or the PAB comprises one or more filters to act upon the input signal or a signal derived therefrom.

13. The bass enhancement system in accordance with claim 1, wherein the compressor comprises a real bass enhancement function.

14. The bass enhancement system in accordance with claim 1, further comprising a band generator having one or more filters, each of the filters configured to generate one or more filtered signals from the input signal, the compressor and/or PAB configured to accept one or more of the filtered signals.

15. The bass enhancement system in accordance with claim 14, wherein the filters comprise one or more cut-off frequencies, the cut-off frequencies dependent on an external control signal and/or the internal control signal.

16. The bass enhancement system in accordance with claim 14, wherein one or more of the filters is a band pass filter.

17. The bass enhancement system in accordance with claim 1, wherein the combination block comprises a limiter for limiting a power level of the enhanced output signal.

18. The bass enhancement system in accordance with claim 1, wherein the PAB comprises a harmonic overtone generator (HOG) for adding one or more harmonics from the input signal or signal derived therefrom to the second enhanced signal, the output amplitude of the HOG dependent on the internal control signal.

19. The bass enhancement system in accordance with claim 1, wherein the system is integrated into at least one of an application specific integrated circuit, a hardware description language, a system-on-a-chip, a field programmable gate array, or a digital signal processor.

20. A method for producing an enhanced output signal with improved bass from an input signal comprising;
    compressing the input signal or a signal derived therefrom to form a first enhanced signal;
    generating one or more harmonics from the input signal or a signal derived therefrom to form at least a portion of a second enhanced signal;
    monitoring one or more parameters of the input signal or a signal derived therefrom to form a strength signal, wherein the strength signal takes a form of a loudspeaker excursion estimation; and
    mixing the first enhanced signal and the second enhanced signal in proportions dependent on the strength signal to form the enhanced output signal.

21. The method in accordance with claim 20, further comprising band pass filtering the input signal to derive one or more filtered signals.

22. The method in accordance with claim 20, further comprising limiting the first enhanced signal based on a threshold parameter.

23. The method in accordance with claim 22, further comprising accepting an external control signal, and setting the threshold parameter based upon the external control signal.

24. A method for bass enhancing an audio input signal to produce an enhanced output signal comprising;
    isolating one or more band signals from the audio input signal;

amplifying one or more of the band signals with an adjustable gain parameter to form a first enhanced signal;

applying a psychoacoustic audio enhancement algorithm to one or more band signals to form a second enhanced signal based upon a loudspeaker excursion estimation related to one or more parameters of the input signal;

delaying one or more band signals to form a delayed signal; and mixing the delayed signal, the first enhanced signal and the second enhanced signal to produce the enhanced output signal.

25. The method of claim 24, further comprising monitoring one or more band signals to produce a strength signal, the mixing, the amplifying and/or the psychoacoustic audio enhancement algorithm dependent upon the strength signal.

* * * * *